United States Patent [19]
Lee et al.

[11] Patent Number: 5,751,048
[45] Date of Patent: May 12, 1998

[54] SEMICONDUCTOR DEVICE HAVING A CONTACT WINDOW STRUCTURE

[75] Inventors: Yong Hee Lee, Seoul; Young Woo Seo, Suwon, both of Rep. of Korea

[73] Assignee: Samsung Electronics Co., Ltd., Suwon, Rep. of Korea

[21] Appl. No.: 553,038

[22] Filed: Nov. 3, 1995

Related U.S. Application Data

[62] Division of Ser. No. 155,745, Nov. 23, 1993, Pat. No. 5,491,100.

Foreign Application Priority Data

Nov. 23, 1992 [KR] Rep. of Korea ............ 92-22040

[51] Int. Cl.⁶ ............................ H01L 29/76; H01L 29/94
[52] U.S. Cl. .................................... 257/412; 257/413
[58] Field of Search ............................ 257/412, 413, 257/382, 383, 384, 763, 764

[56] References Cited

U.S. PATENT DOCUMENTS

| | | | |
|---|---|---|---|
| 4,740,484 | 4/1988 | Norstrom | 437/200 |
| 4,935,380 | 6/1990 | Okumura | 437/44 |
| 4,978,637 | 12/1990 | Liou | 437/193 |
| 5,089,863 | 2/1992 | Satoh | 257/613 |
| 5,097,300 | 3/1992 | Takeuchi | 257/412 |
| 5,158,903 | 10/1992 | Hori et al. | 257/412 |
| 5,241,203 | 8/1993 | Hsu et al. | 257/412 |
| 5,262,352 | 11/1993 | Woo | 437/193 |

FOREIGN PATENT DOCUMENTS

| | | | |
|---|---|---|---|
| 0-497596 | 8/1992 | European Pat. Off. | |
| 5-880870 | 5/1983 | Japan . | |
| 59-184568 | 10/1984 | Japan | 257/613 |
| 1-037036 | 2/1989 | Japan . | |
| 1-041245 | 2/1989 | Japan . | |
| 5-182982 | 7/1993 | Japan . | |
| 5-235338 | 9/1993 | Japan | 257/613 |

*Primary Examiner*—Wael Fahmy
*Attorney, Agent, or Firm*—Cushman Darby & Cushman, IP Group of Pillsbury Madison & Sutro LLP

[57] ABSTRACT

A structure of a semiconductor device is disclosed whereby a gate insulating layer, a polycrystalline silicon layer, a tungsten silicide layer and a first insulating layer are formed on a semiconductor substrate. Gates are formed by the removal of the layers by dry etching, wherein the etch rate of the tungsten silicide layer is faster than the other layers, thereby forming an undercut region in the tungsten silicide layer. A second insulating layer is formed on the surface of the resultant structure to form spacers, and a contact window is formed between the gates via an etching process. The second insulating layer portion which forms the spacers need not be thick to prevent etching of the gates when forming the contact window, therefore good step coverage is achieved and reliability of the device is increased.

4 Claims, 4 Drawing Sheets

FIG. IA
(PRIOR ART)
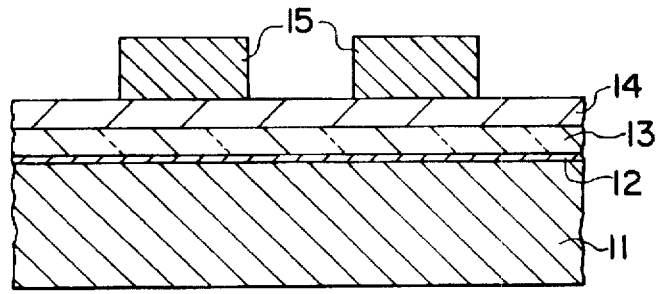
FIG. IB
(PRIOR ART)
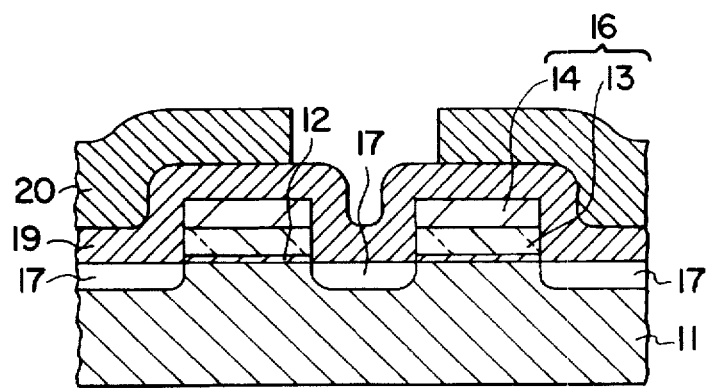
FIG. IC
(PRIOR ART)
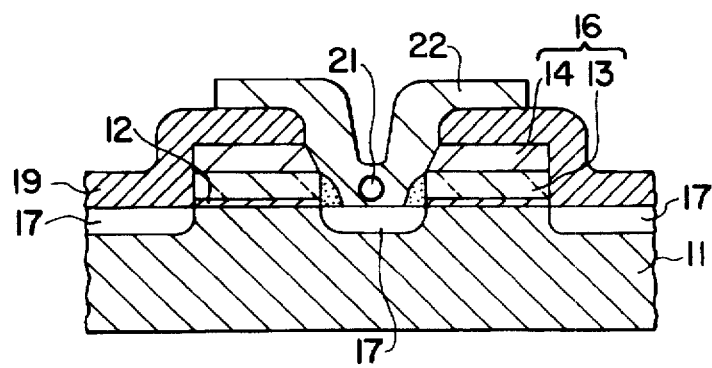

SEMICONDUCTOR DEVICE HAVING A CONTACT WINDOW STRUCTURE

This application is a division of Ser. No. 08/155,745, filed Nov. 23, 1993, now U.S. Pat. No. 5,491,100.

FIELD OF THE INVENTION

The present invention relates to a semiconductor device. More particularly it relates to a semiconductor device having self-aligned contact windows, without increasing the distance between adjacent transistor gates.

BACKGROUND OF THE RELATED ART

There is a continuous desire in the semiconductor industry to increase the density of components in a semiconductor device. A factor which greatly affects this desire is the micropattern techniques used in the formation of the components in the semiconductor device.

Furthermore, element formations stacked vertically on a substrate have been developed, increasing the thickness of the semiconductor layers. Because of this, device reliability is largely dependent upon the step coverage of a layer upon which another layer is stacked.

The spacing between individual layers is conventionally increased as the vertical stacking of components increases because of the improper alignment of the layers. Step coverage is degraded as the area for a contact window which allows for an electrical contact to a source or drain region between the elements is increased to, for instance, over 1.5 times the size of the source or drain region itself.

In addition, the degraded step coverage causes a decrease in the size of the contact windows formed, which in turn causes an increased contact resistance. This increased contact resistance lowers the current driving capacity of the semiconductor device.

Heretofore conventional research of stacking layers has left as inevitable the need for contact windows having a larger width-to-height (aspect) ratio as the vertical stacking of the layers increases. This invention provides a semiconductor device which allows for a reduced contact hole aspect ratio.

FIGS. 1A to 1C illustrate a conventional process for manufacturing a semiconductor device whereby a contact window is formed which allows an electrical contact to be made to a transistor source or drain formed between the gates of a dynamic random access memory (DRAM) device.

Referring to FIG. 1A, a gate-insulating layer 12 is formed on a P-type silicon semiconductor substrate 11 of a silicon oxide or a silicon nitride by an oxidation method, a chemical vapor deposition (CVD) method or a physical vapor deposition (PVD) method. A polycrystalline silicon layer 13 is formed on the gate-insulating layer 12, and then a cap oxide layer 14 is formed on the polycrystalline silicon layer 13. The cap oxide layer 14 is formed of a silicon oxide via a high temperature oxidation (HTO) method.

A first photoresist pattern 15 is then formed on the cap oxide layer 14 by a conventional photolithographic process. The first photoresist pattern 15 protects a portion on which a gate 16 will be formed from being etched.

Referring to FIG. 1B, the portions of the cap oxide layer 14, the polycrystalline silicon layer 13, and the gate insulating layer 12 which are exposed by the first photoresist pattern 15 are successively removed by a dry or wet etching process, to expose the semiconductor substrate 11 and thereby form a gate 16. Thereafter, the first photoresist pattern 15 is removed.

Spacers (not shown) are formed on opposite sides of the gate 16. Then, using the spacers as a mask, a high density of N-type impurities are ion-implanted over the resultant structure to form the source and drain regions 17 having a lightly-doped drain (LDD) structure. An oxide layer 19 is then formed on the surface of the resultant structure via an HTO method. A second photoresist pattern 20 is then formed on the oxide layer 19 such that the oxide layer 19 between the gates 16 is exposed.

Referring to FIG. 1C, the portion of the oxide layer 19 which is exposed by the second photoresist pattern 20 is removed to form a contact window 21 between the gates 16. Then the second photoresist pattern 20 is removed.

A conductive layer 22 is then formed.

As described above, the conventional method for manufacturing a semiconductor device has the disadvantage of a decreased spacing between the gates 16. This is because the portion of the oxide layer 19 and the cap oxide layer 14 which was formed over the gates 16 is etched during the etching process for forming the contact window. This causes an etching of the exposed corner of the gate 16 prior to when forming the contact window to the semiconductor substrate.

Therefore, in order to prevent the corners of the gate 16 from being exposing prior to completion of the etching to the expose the semiconductor substrate, either a safe space must be securely maintained between the gates 16, or the thickness of the oxide layer 19 on the gate 16 must be increased.

However, according to the conventional method, the integration density of the semiconductor device is limited as the safe space is maintained between the gates 16. In addition, if the thickness of the oxide layer 19 on the gate 16 is increased, the aspect ratio of the contact window is increased and a subsequent layer, such as the metal lines deposited during the following metallization process, cannot completely fill up the contact window. Therefore, the conventional method has the disadvantage of deteriorated step coverage and reduced reliability of the semiconductor device.

SUMMARY OF THE INVENTION

It is an object of the present invention to provide a semiconductor device which is capable of allowing for increased integration by effectively forming a contact window without the need to increase the spacing between the gates.

According to the present invention, a self-aligned contact window is formed by the sequential formation of a gate insulating layer, a polycrystalline silicon layer, a tungsten silicide layer, and a first insulating layer on a semiconductor substrate. Then, the gate insulating layer, the polycrystalline silicon layer, the tungsten silicide layer, and the first insulating layer are sequentially dry etched, thereby forming the gates out of said first and second conductive layers and, at the same time, opening a contact window to an associated source and drain.

The tungsten silicide layer is etched faster than the first insulating layer because it is formed of a silicon oxide or silicon nitride, thus forming an undercut on the upper portion of the gate layer. Then, a second insulating layer for forming spacers is formed on the whole surface of the resultant structure, and a contact window is formed by an etching process.

BRIEF DESCRIPTION OF THE DRAWINGS

The above objects and other advantages of the present invention will become more apparent by describing in detail a preferred embodiment thereof with reference to the attached drawings, in which:

FIGS. 1A to 1C illustrate a process for manufacturing a semiconductor device according to a conventional technique;

DESCRIPTION OF THE PREFERRED EMBODIMENTS

Figure 2A:
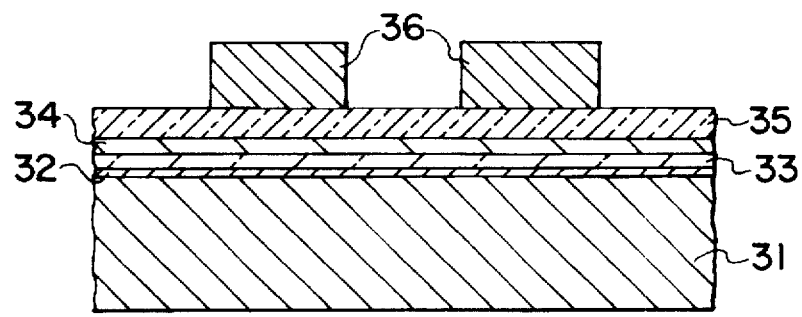
FIGS. 2A to 2E illustrate a process for manufacturing a semiconductor device according to the present invention.

FIGS. 2A to 2E particularly illustrate a process for forming a contact window between gates of a DRAM device.

A gate insulating layer 32 is formed on a P-type silicon semiconductor substrate 31. The gate insulating layer 32 is formed of an oxide, a silicon nitride, or successively stacked layers of an oxide and a nitride. A polycrystalline silicon layer 33 and a refractory metal silicide layer 34 of, for example, tungsten silicide are then sequentially formed on the gate insulating layer 32 via an oxidation, CVD or PVD method. A first insulating layer 35 is then formed of a silicon oxide via a PVD or CVD method on the tungsten silicide layer 34.

Thereafter, a first photoresist layer 36 is formed on the first insulating layer 35 via a photolithographic method to protect portions of the first insulating layer 35 on which gates will be formed.

Figure 2B:
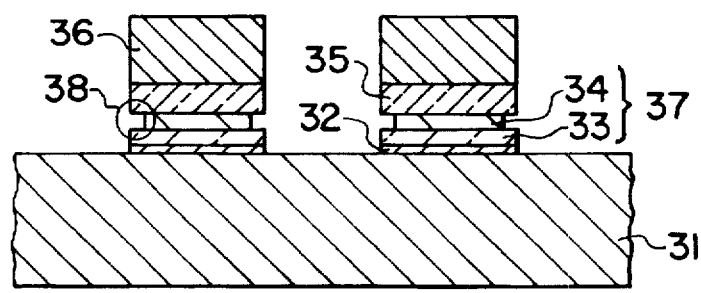

Referring to FIG. 2B, the portions of the first insulating layer 35, the tungsten silicide layer 34, and the polycrystalline silicon layer 33 which are exposed by the first photoresist pattern 36 are sequentially removed through a dry etching process to form the gates 37. The dry etching process uses ingredients of a mixture such as sulfur-hexafluoride ($SF_6$) gas and chlorine ($Cl_2$) gas, with a mixture of $SF_6$ 20 sccm/$cl_2$ 50 sccm (where sccm is an abbreviation of standard cubic centimeter). The tungsten silicide layer 34 is etched faster than the first insulating layer 35, forming an undercut 38 under the first insulating layer 35.

Thereafter, the polycrystalline silicon layer 33 is dry-etched using Hbr and $Cl_2$ gas having a mixture of hydrogen bromide (Hbr) of 70 sccm/$Cl_2$, to have the same size as the first insulating layer 35 and the polycrystalline silicon layer 33. The tungsten silicide layer 34 is relatively small due to being over-etched.

Figure 2C:
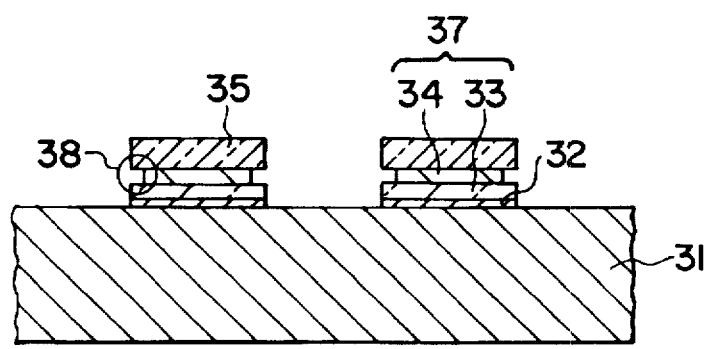

Referring to FIG. 2C, the first photoresist pattern 36 is removed. Then, a treatment of an SC1 solution for 10–60 minutes is applied to enlarge the undercut 38. The SC1 solution (wet solution) is obtained by mixing ammonium hydroxide ($NH_4OH$), hydrogen peroxide ($H_2O_2$), water ($H_2O$) in a ratio of 1:2:3.

Figure 3A:
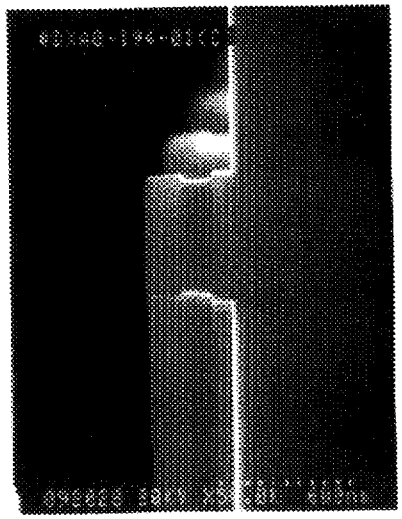
FIG. 3 is a photograph taken by a scanning electromicroscope (SEM) showing gates having undercuts obtained according to the present invention.
Figure 3B:
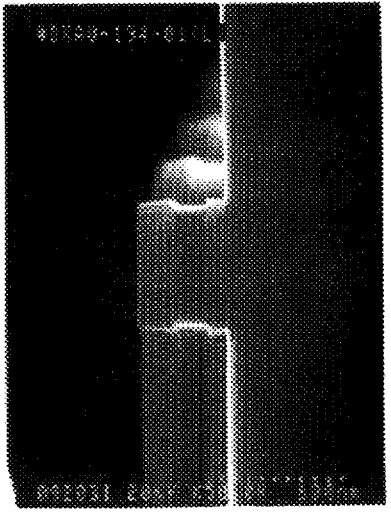
Figure 3C:
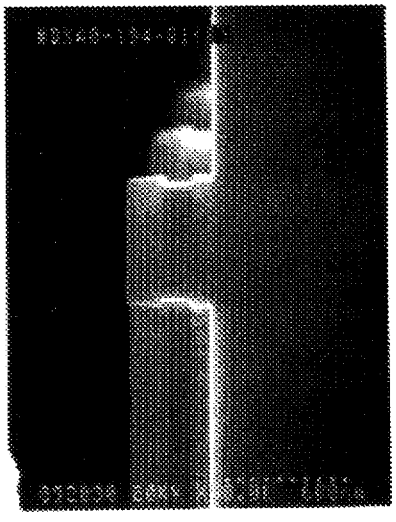

The etch rates of the first insulating layer 35, the tungsten silicide layer 34, and the polycrystalline silicide layer 33 have a ratio of 30:140:24, respectively. Thus, the tungsten silicide layer 34 is etched more, enlarging the undercut 38. The principle portion of the undercut 38 taken by SEM is shown in FIG. 3.

Figure 2D:
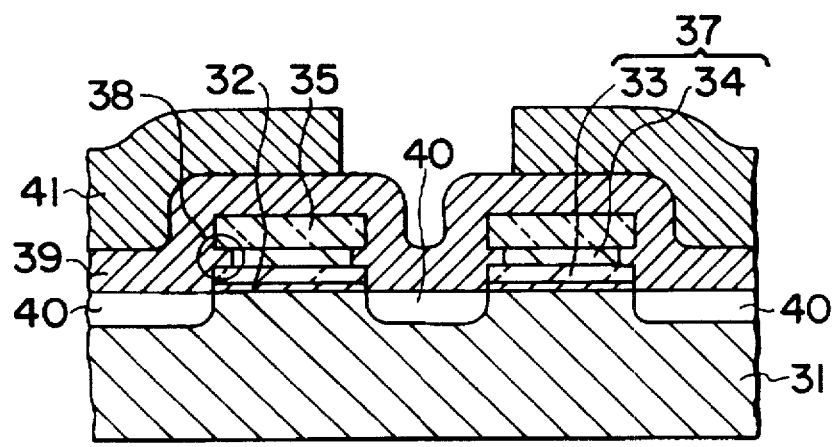

Referring to FIG. 2D, an N-type impurity is ion-implanted into the semiconductor substrate 31 using the unetched gate pattern as a mask to form the source and drain regions 40.

A second insulating layer 39 is formed over the surface of the resultant structure, using an HTO method, forming spacers 46 (shown in FIG. 2E) of a silicon oxide on the sides of the gate 37.

A second photoresist pattern 41 is formed to shield the second insulating layer 39 which remains.

Figure 2E:
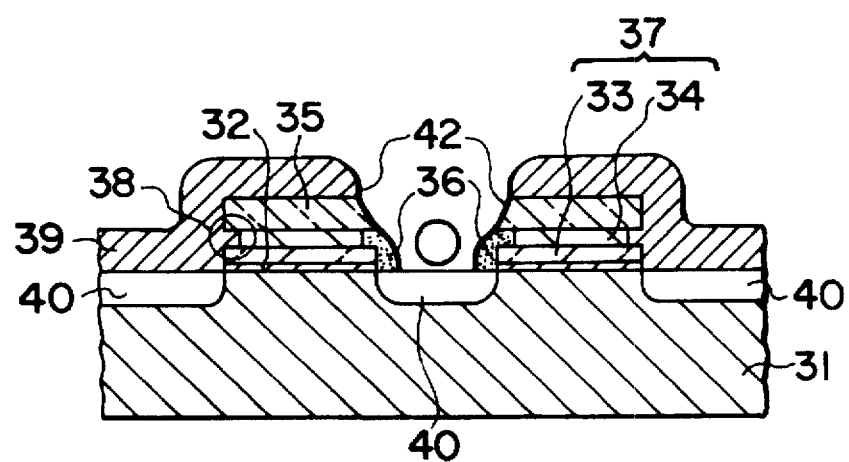

Referring to FIG. 2E, the second insulating layer 39 which is exposed by the second photoresist pattern 41 is removed to form a self-aligned contact window 42. The second photoresist pattern 41 is then removed using a developer solution. Thereafter, a conductive layer (not shown) is formed in said contact window.

The second insulating layer 39 may be etched-back to form the contact window without forming the second photoresist pattern.

Therefore, it is seen that the tungsten silicide layer 34 is not externally exposed in the contact window, even though the corner of the first insulating layer 35 is slightly etched when etching the second insulating layer 39, because the tungsten silicide layer 34 has the undercut 38 portion under the first insulating layer 35. Therefore, a safe spacing between the gates 37 is maintained in the formation of the self-aligned contact window 42.

Therefore, there is no need to thickly form an insulating layer for forming a spacer to prevent exposure or etch of a gate material when forming a contact window between gates. This invention therefore provides for a good step coverage of the conductive layer and avoids reliability problems.

Moreover, the present invention allows for the achievement of a higher integration density in a semiconductor device since the spacing between the gates may need not be increased for the formation of a contact window.

It is to be understood by those skilled in the art that various changes in the form and details of the embodiments described herein may be effected without departing from the spirit and scope of the invention as defined by the appended claims.

What is claimed is:

1. A semiconductor device with a gate structure, said semiconductor device comprising:

a gate insulating layer formed on a semiconductor substrate;

a gate structure having a first conductive layer of polycrystalline silicon and a second conductive layer of refractory metal silicide, said first conductive layer being formed on said gate insulating layer and said second conductive layer being formed on said first conductive layer, said second conductive layer having a recessed edge portion with respect to an edge portion of said first conductive layer; and a first insulating layer formed on a top surface of said second conductive layer and having a protrusion portion with respect to an edge of said second conductive layer.

2. A semiconductor device according to claim 1, further comprising a source region and a drain region adjacent to said gate structure, and a second insulating layer formed on at least part of said first insulating layer, on said edge portion of said recessed second conductive layer and on said edge portions of said first conductive layer and said first insulating layer.

3. A semiconductor device according to claim 1, wherein said second conductive layer of refractory metal silicide has a faster etch rate than those of said first conductive layer of polycrystalline silicon and said gate insulating layer.

4. A semiconductor device according to claim 3, wherein said first insulating layer has a slower etch rate than said etch rate of said second conductive layer.

* * * * *